(12) United States Patent
Bleeker et al.

(10) Patent No.: US 9,690,210 B2
(45) Date of Patent: Jun. 27, 2017

(54) LITHOGRAPHIC APPARATUS AND DEVICE MANUFACTURING METHOD

(75) Inventors: Arno Jan Bleeker, Westerhoven (NL); Laurentius Cornelius De Winter, Vessem (NL)

(73) Assignee: ASML NETHERLANDS B.V., Veldhoven (NL)

( * ) Notice: Subject to any disclaimer, the term of this patent is extended or adjusted under 35 U.S.C. 154(b) by 313 days.

(21) Appl. No.: 14/234,352

(22) PCT Filed: Jul. 20, 2012

(86) PCT No.: PCT/EP2012/064302
§ 371 (c)(1),
(2), (4) Date: Jan. 22, 2014

(87) PCT Pub. No.: WO2013/023876
PCT Pub. Date: Feb. 21, 2013

(65) Prior Publication Data
US 2014/0152969 A1    Jun. 5, 2014

Related U.S. Application Data

(60) Provisional application No. 61/525,029, filed on Aug. 18, 2011.

(51) Int. Cl.
*G03B 27/52*    (2006.01)
*G03B 27/54*    (2006.01)
(Continued)

(52) U.S. Cl.
CPC ...... *G03F 7/70608* (2013.01); *G03F 7/70191* (2013.01); *G03F 7/70291* (2013.01); *G03F 7/70558* (2013.01)

(58) Field of Classification Search
CPC ............ G03F 7/70191; G03F 7/70291; G03F 7/70558; G03F 7/70608; G03F 7/70616;
(Continued)

(56) References Cited

U.S. PATENT DOCUMENTS 4,090,206 A    5/1978    Pfeifer
4,447,126 A    5/1984    Heidrich
(Continued)

FOREIGN PATENT DOCUMENTS

CN    101312120    11/2008
DE    4315580    11/1994
(Continued)

OTHER PUBLICATIONS

English translation of JP05-013292, published on Jan. 22, 1993.*
(Continued)

*Primary Examiner* — Christina Riddle
(74) *Attorney, Agent, or Firm* — Pillsbury Winthrop Shaw Pittman LLP

(57) ABSTRACT

A lithographic apparatus is provided and configured to project a patterned beam of radiation onto a substrate. The apparatus has a measurement system to provide measurement data related to a thickness of a resist layer on the substrate, and a controller to control the operation of the lithographic apparatus such that a radiation intensity level in the patterned beam to be projected onto the substrate is controlled based on the measurement data.

19 Claims, 7 Drawing Sheets

(51) Int. Cl.
  *G03B 27/32* (2006.01)
  *G03F 7/20* (2006.01)
(58) Field of Classification Search
  CPC ............ G03F 7/70625; G03F 7/70383; G03F 7/70391
  USPC ......... 355/46, 52, 53, 55, 60, 66–71, 72, 77; 356/485, 496, 503, 630; 250/492.1, 250/492.2, 492.22, 493.1, 548, 504 R
  See application file for complete search history.

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,614,864 A * | 9/1986 | Wu | G03F 9/7026 250/201.4 |
| 4,640,573 A | 2/1987 | Kataoka | |
| 4,780,730 A | 10/1988 | Dodge | |
| 4,780,747 A * | 10/1988 | Suzuki | G03F 7/70558 355/30 |
| 4,796,038 A | 1/1989 | Allen | |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,363,171 A * | 11/1994 | Mack | G03F 7/7085 355/53 |
| 5,457,488 A | 10/1995 | Nakamura | |
| 5,481,392 A | 1/1996 | Damer | |
| 5,523,193 A | 6/1996 | Nelson | |
| 5,526,093 A * | 6/1996 | Takahashi | G03F 7/70058 355/53 |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,726,756 A * | 3/1998 | Aki | G03F 7/704 250/559.27 |
| 5,838,024 A | 11/1998 | Masuda | |
| 5,840,451 A | 11/1998 | Moore | |
| 5,994,006 A * | 11/1999 | Nishi | G03F 7/701 430/22 |
| 5,999,247 A * | 12/1999 | Tezuka | G03F 7/70558 355/53 |
| 6,037,965 A | 3/2000 | Gross | |
| 6,133,986 A | 10/2000 | Johnson | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,482,573 B1 | 11/2002 | Bhakta et al. | |
| 6,529,282 B1 * | 3/2003 | Stirton | G03F 7/70625 356/630 |
| 6,531,681 B1 | 3/2003 | Markle | |
| 6,559,438 B1 | 5/2003 | Drobot | |
| 6,683,727 B1 | 1/2004 | Goring | |
| 6,730,925 B1 * | 5/2004 | Ozawa | G03F 7/70358 250/548 |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,477,403 B2 * | 1/2009 | Gui | G03F 7/70275 355/77 |
| 7,532,307 B2 | 5/2009 | Van Der Schaar et al. | |
| 7,969,636 B2 | 6/2011 | Naito | |
| 2002/0115021 A1 | 8/2002 | Piao | |
| 2002/0126479 A1 | 9/2002 | Zhai | |
| 2002/0171047 A1 | 11/2002 | Chan | |
| 2003/0039896 A1 * | 2/2003 | Iriguchi | G03F 7/7035 430/5 |
| 2003/0043582 A1 | 3/2003 | Chan | |
| 2003/0091277 A1 | 5/2003 | Mei | |
| 2004/0124372 A1 | 7/2004 | Gil | |
| 2004/0135159 A1 | 7/2004 | Siegel | |
| 2004/0257629 A1 | 12/2004 | Noehte | |
| 2005/0167508 A1 | 8/2005 | Syms | |
| 2006/0001855 A1 | 1/2006 | Lof | |
| 2006/0103719 A1 | 5/2006 | Katzir | |
| 2006/0108508 A1 | 5/2006 | Khalid | |
| 2006/0114440 A1 * | 6/2006 | Sekigawa | G03F 7/2057 355/69 |
| 2007/0003840 A1 | 1/2007 | Van Der Schaar et al. | |
| 2007/0034890 A1 | 2/2007 | Daschner | |
| 2007/0182808 A1 | 8/2007 | Stiblert | |
| 2007/0296936 A1 | 12/2007 | Kato | |
| 2008/0042969 A1 | 2/2008 | Baker | |
| 2008/0047445 A1 | 2/2008 | Berner | |
| 2008/0137051 A1 | 6/2008 | Maly | |
| 2008/0143990 A1 | 6/2008 | Hirano | |
| 2008/0160211 A1 | 7/2008 | Siegel | |
| 2008/0210888 A1 | 9/2008 | Inoue | |
| 2008/0239267 A1 | 10/2008 | Suzuki et al. | |
| 2008/0304034 A1 | 12/2008 | Ockwell et al. | |
| 2009/0296063 A1 | 12/2009 | Opower | |
| 2010/0142757 A1 | 6/2010 | Sandstrom | |
| 2010/0208229 A1 * | 8/2010 | Shin | G03F 7/70275 355/77 |
| 2010/0265557 A1 | 10/2010 | Sallander | |
| 2011/0051211 A1 | 3/2011 | Walther | |
| 2011/0188016 A1 | 8/2011 | De Jager | |

FOREIGN PATENT DOCUMENTS

| | | | |
|---|---|---|---|
| DE | 4315581 | 11/1994 | |
| DE | 19813127 | 10/1998 | |
| EP | 1 835 347 | 9/2007 | |
| JP | 57-152273 | 9/1982 | |
| JP | H01-257326 | 10/1989 | |
| JP | 05013292 A * | 1/1993 | |
| JP | 06-275936 | 9/1994 | |
| JP | 08-064510 | 3/1996 | |
| JP | H09-326344 | 12/1997 | |
| JP | 2000208411 A * | 7/2000 | G03F 7/70058 |
| JP | 2003-220484 | 8/2003 | |
| JP | 2007-013169 | 1/2007 | |
| JP | 2008-250139 | 10/2008 | |
| JP | 2008-306186 | 12/2008 | |
| WO | 97/34171 | 9/1997 | |
| WO | 98/33096 | 7/1998 | |
| WO | 98/38597 | 9/1998 | |
| WO | 2005/006082 | 1/2005 | |
| WO | 2006/002668 | 1/2006 | |
| WO | 2006/064363 | 6/2006 | |
| WO | 2007/050022 | 5/2007 | |
| WO | 2007/050023 | 5/2007 | |
| WO | 2007/098935 | 9/2007 | |
| WO | 2008/071347 | 6/2008 | |
| WO | 2010/032224 | 3/2010 | |
| WO | 2010/040696 | 4/2010 | |
| WO | 2010/151123 | 12/2010 | |
| WO | 2011/026610 | 3/2011 | |

OTHER PUBLICATIONS

English translation of JP 2000-208411, published Jul. 28, 2000.*
Chinese Office Action dated Feb. 16, 2015 in corresponding Chinese Patent Application No. 201280040076.6.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp, date unknown, obtained Feb. 2009).

(56) References Cited

OTHER PUBLICATIONS

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Search Report and Written Opinion mailed Oct. 8, 2012 for corresponding International Patent Application No. PCT/EP2012/064302.
Singapore Search Report and Written Opinion dated Dec. 23, 2014 in corresponding Singapore Patent Application No. 2014004196.
Japanese Office Action dated Jan. 27, 2015 in corresponding Japanese Patent Application No. 2014-525377.
International Search Report and Written Opinion mailed Feb. 27, 2014 for corresponding International Patent Application No. PCT/EP2012/064302.
Korean Office Action dated Nov. 19, 2015 in corresponding Korean Patent Application No. 10-2014-7003810.

\* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2012/064302, filed on Jul. 20, 2012, which claims the benefit of priority of U.S. provisional application No. 61/525,029, filed on Aug. 18, 2011. This provisional application is hereby incorporated in its entirety by reference.

FIELD

The present invention relates to a lithographic apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like.

SUMMARY

In a lithographic process, a proportion of the radiation projected onto a resist layer formed on a substrate may be redirected (e.g., reflected) back from the resist layer. For example, some radiation may reflect from the lower surface of the resist, namely at the interface between the resist and the substrate or another layer interposed between the resist and the substrate. The superposition of the incident radiation and the redirected radiation may result in standing waves within the resist layer. This may cause one or more problems.

For example, the intensity of a standing wave at the surface of the resist layer, and therefore the intensity of the radiation redirected back from the resist layer, may be dependent on the thickness of the resist layer and optionally one or more other layers formed on the substrate. A small change in resist layer thickness may result in the significant change in the intensity of the redirected radiation. Such redirected radiation will not contribute to the exposure dose of the resist. Accordingly a change in the thickness of the resist may result in a change in the exposure dose received by the resist for a given intensity of beam of radiation projected onto the resist layer. This, in turn, may affect the critical dimension (CD) of the features of the pattern being formed. Therefore, a variation in the thickness of the resist layer on the substrate may result in a deterioration of the critical dimension uniformity (CDU), which is undesirable.

In order to avoid a reduction in the critical dimension uniformity, it may be desirable to reduce the variation in the thickness of a resist layer across the substrate. However, this may be difficult and/or expensive, especially for relatively large substrates.

Alternatively or additionally, a so-called bottom anti reflection coating (BARC) may be used in order to reduce the reflection of radiation from the lower surface of the resist layer. However, this may result in additional process costs because it is necessary to perform additional processes to a substrate.

Alternatively or additionally, the problem may be reduced or overcome by use of a radiation source having a relatively broad bandwidth. This is because the redirection of the radiation from the resist layer depends on the thickness of the resist layer relative to the wavelength of the radiation. Therefore, if the radiation source has a relatively broad bandwidth, for any particular thickness of resist layer some wavelengths of the radiation will be redirected relatively strongly and other wavelengths will be redirected relatively weakly. Accordingly, the overall redirection of the broad-band radiation may not vary greatly with variations of the thickness of the resist layer. However, it may be desirable to use a relatively narrow bandwidth radiation source, such as a laser diode.

It is therefore desirable, for example, to provide a system in which the critical dimension uniformity is less sensitive to variation in the thickness of the resist layer.

According to an embodiment of the invention, there is provided a lithographic apparatus, configured to project a patterned beam of radiation onto a substrate, the apparatus comprising:

a measurement system, configured to provide measurement data related to a thickness of a resist layer on the substrate; and a controller, configured to control the operation of the lithographic apparatus such that a radiation intensity level in the patterned beam to be projected onto the substrate is controlled based on the measurement data.

According to an embodiment of the invention, there is provided a device manufacturing method, comprising:

using a lithographic apparatus to project a patterned beam of radiation onto a substrate;

obtaining measurement data related to a thickness of a resist layer on the substrate; and controlling the operation of the lithographic apparatus to control the radiation intensity level in the patterned beam to be projected onto the substrate based on the measurement data.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to a lithographic apparatus that may include a programmable patterning device that may, for example, be comprised of an array of self-emissive constrast devices. Further information regarding such lithographic apparatus may be found in PCT patent application publication no. WO 2010/032224 A2 and U.S. patent application publication no. US 2011-0188016, which are hereby incorporated herein in their entirety by reference.

Figure 1:
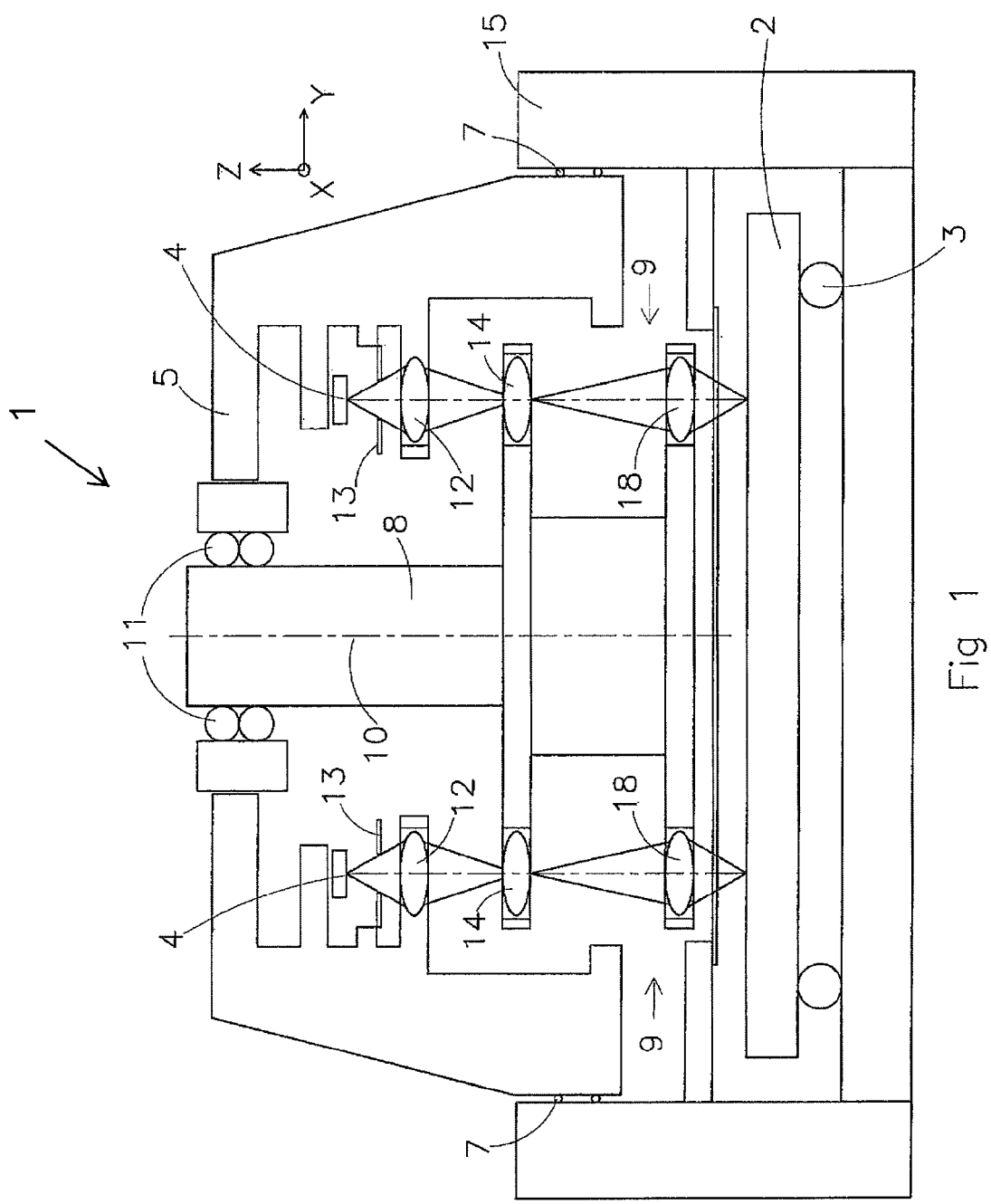
FIG. 1 depicts a part of a lithographic apparatus according to an embodiment of the invention.

FIG. 1 schematically depicts a schematic cross-sectional side view of a part of a lithographic apparatus. In this embodiment, the lithographic apparatus has individually controllable elements substantially stationary in the X-Y plane as discussed further below although it need not be the case. The lithographic apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the lithographic apparatus is suitable for roll-to-roll manufacturing.

The lithographic apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
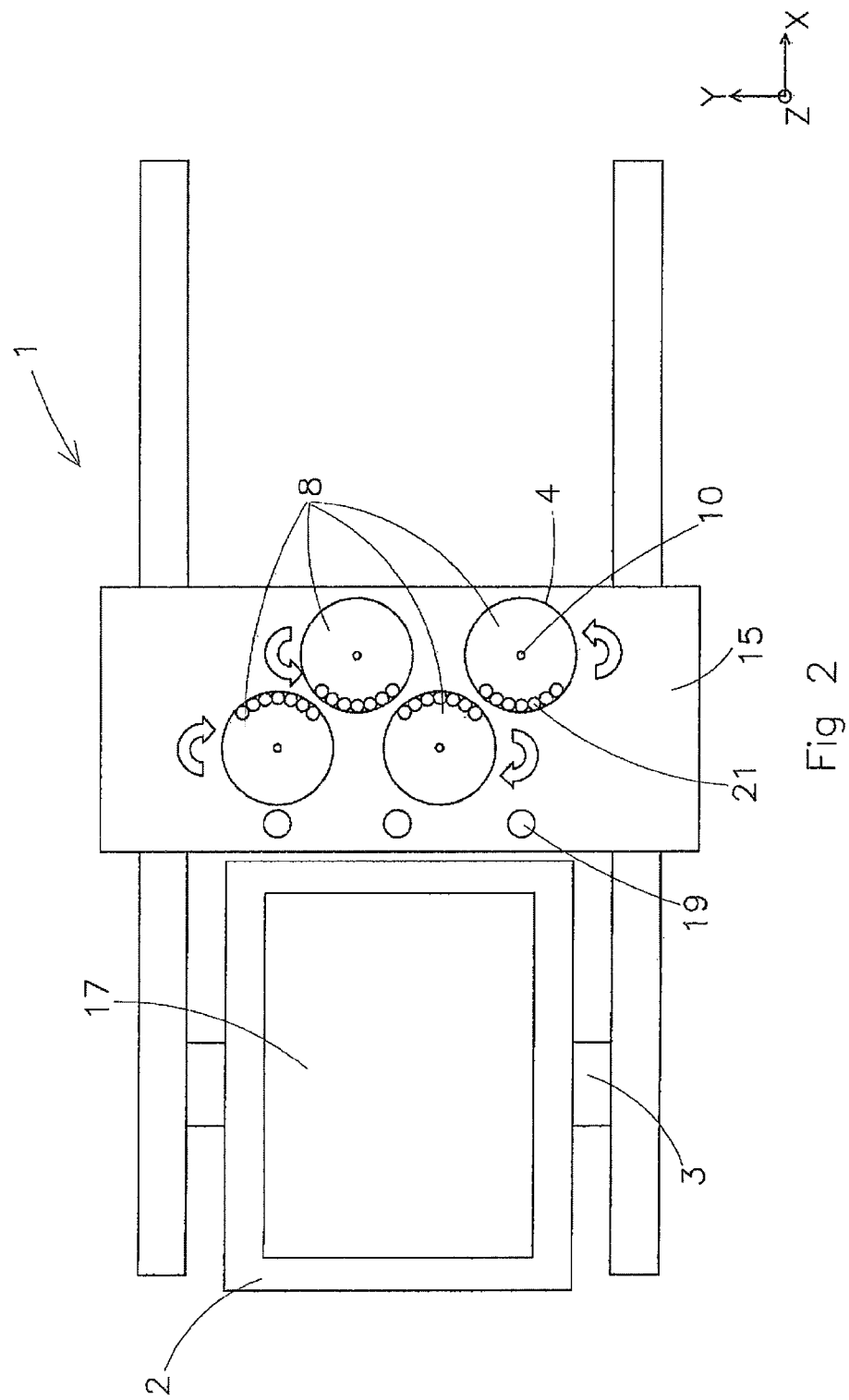
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the lithographic apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The lithographic apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator 11 e.g. a motor. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic apparatus of FIG. 1 having self-emissive contrast devices 4. Like the lithographic apparatus 1 shown in FIG. 1, the lithographic apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (shown in FIG. 1) to provide an image of each of the self-emissive contrast devices 4. The apparatus may be provided with an actuator to rotate the optical column comprising the frame 8 and the lenses 14, 18 with respect to the substrate.

Figure 3:
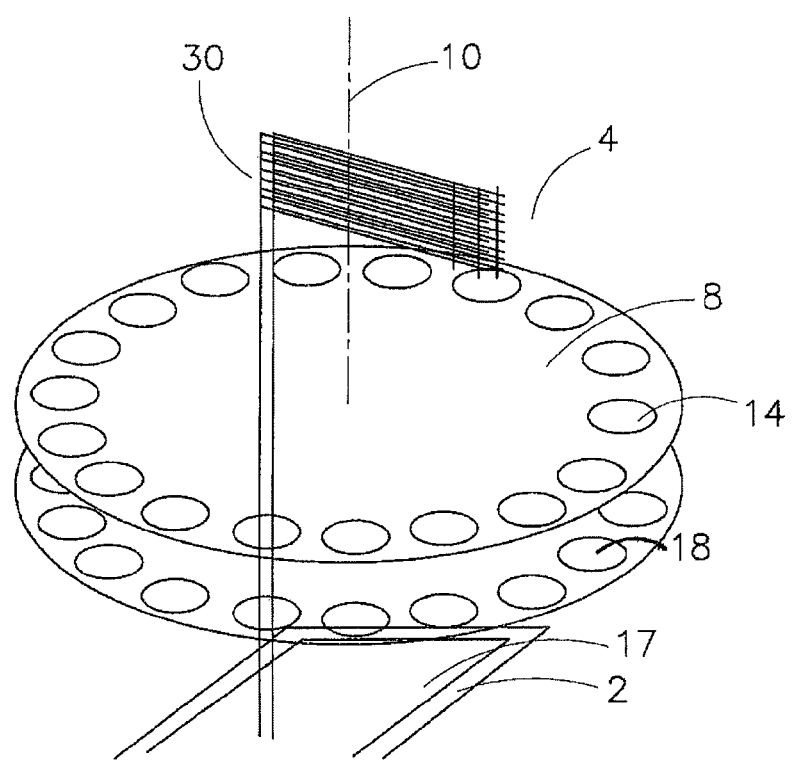
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
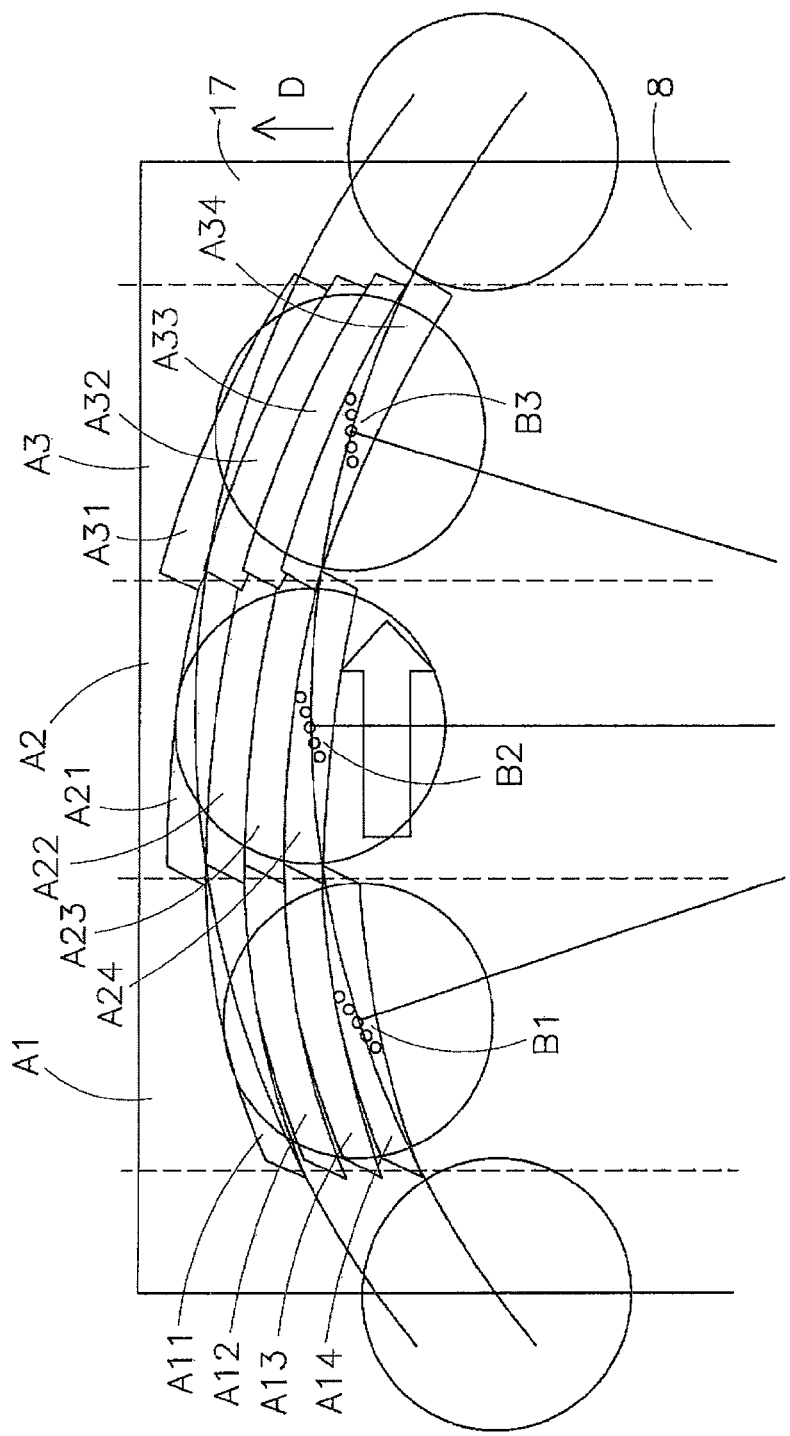
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2, thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, resulting in areas A21, A22, A23 and A24 (areas A21, A22, A23 being previously scanned and A24 being currently scanned as shown in FIG. 4) for each successive scan of beams B2 and resulting in areas A31, A32, A33 and A34 (areas A31, A32, A33 being previously scanned and A34 being currently scanned as shown in FIG. 4) for each successive scan of beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the lithographic apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

Figure 5:
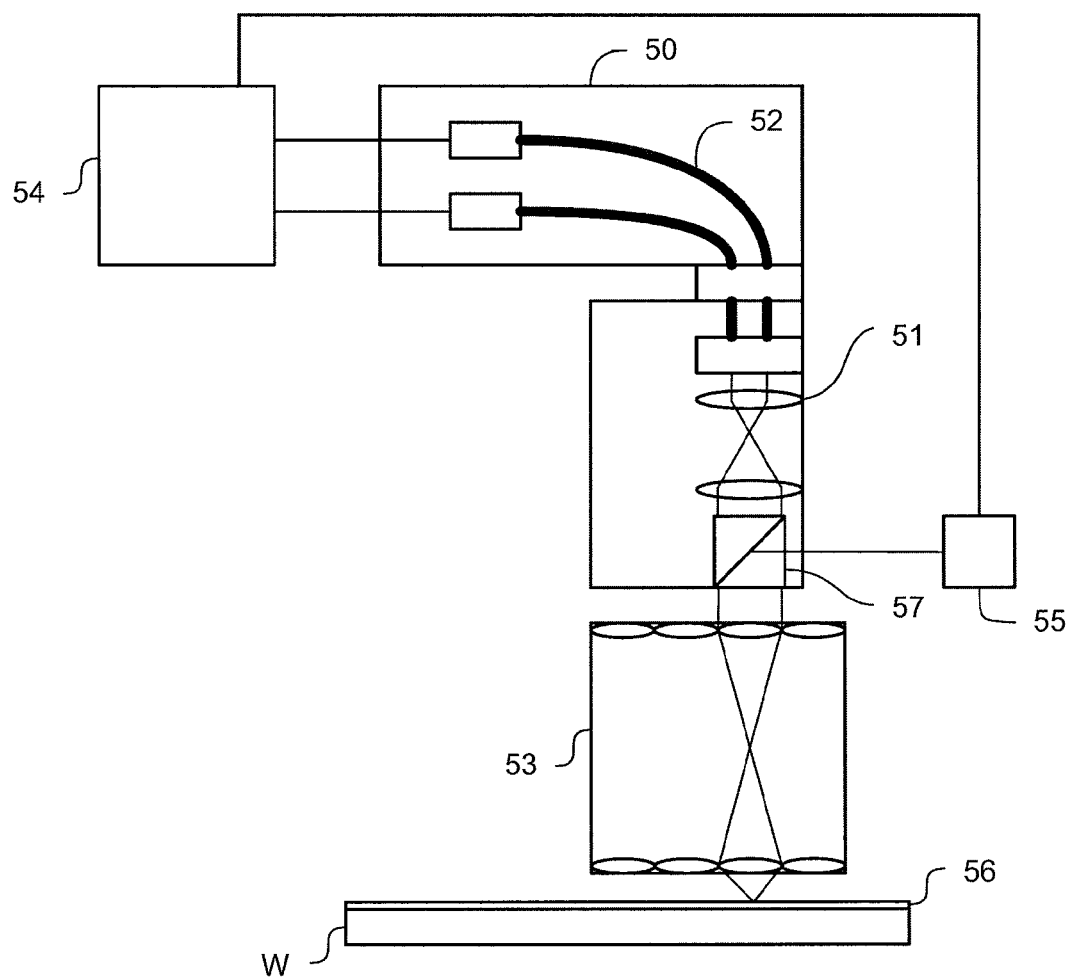
FIG. 5 schematically depicts a lithographic apparatus according to an embodiment of the present invention.

FIG. 5 depicts a lithographic apparatus according to an embodiment of the present invention. As shown, the lithographic apparatus includes a laser unit 50, having a plurality of laser diode units, configured to provide a patterned beam of radiation to a stationary set of optical elements 51, for example by way of optical fibers 52. The stationary set of optical elements 51 in turn provides the patterned beam radiation to a rotating set of optical elements 53, such as an arrangement as discussed above, which projects the patterned beam of radiation onto the resist layer 56 formed on the substrate W. A controller 54 provides control signals to the laser diodes to control the intensity of radiation provided by each laser diode unit at each instant in order to provide a desired pattern on the substrate W.

In addition, the lithographic apparatus includes a radiation intensity sensor 55 that is part of a measurement system and is configured to measure the intensity of the radiation from the patterned beam of radiation that is redirected (e.g., reflected) back from the resist layer 56 on the substrate W.

As shown in FIG. 5, a partial reflector 57 may be provided to direct the radiation redirected back from the resist layer 56 to the radiation intensity sensor 55. The partial reflector 57 may be configured such that the patterned beam of radiation passes through the partial reflector but the radiation redirected back from the resist layer 56, which may return along the same radiation beam path, is reflected to the radiation intensity sensor 55. Although the partial reflector 57 is depicted in FIG. 5 as being the final element in the stationary set of optical elements 51, it may be provided at other locations. For example, the partial reflector 57 may be arranged as the first optical element in the stationary set of optical elements. Furthermore, alternative arrangements for directing the radiation redirected from the resist layer 56 to the radiation intensity sensor 55 may be used.

As explained above, the radiation that is redirected back from the resist layer 56 does not contribute to the exposure dose of the resist. Therefore, the controller 54 may be configured such that it compares the intensity of the radiation redirected back from the resist layer 56 measured by the radiation intensity sensor 55 to the corresponding intensity of the radiation projected onto the substrate in order to determine, for example, the reflectivity of the resist layer 56 (which should be considered generally a measure of the ability of the resist layer to redirect back radiation whether by reflection, diffraction, etc.), which is dependent on the thickness of the resist layer 56, as explained above.

Using the value of the reflectivity of the resist layer 56, the controller may set the intensity of the radiation projected onto the resist layer 56 such that at each location of the substrate the total dose of radiation received by the resist layer 56 (i.e. excluding that which is redirected) is as close as possible to the dose desired to form a desired pattern.

Such an arrangement may therefore be able to provide a pattern with a desired critical dimension uniformity without, for example, the use of a bottom anti-reflection coating, reducing costs, even if the reflectivity of the resist layer 56 varies substantially. For example, an arrangement as discussed above may be used even if the thickness of the resist varies by approximately 50 to 70 nm, which for a desired radiation wavelength may result in redirection of radiation variation between 0 and approximately 20%. Furthermore, the arrangement may be used with a radiation source with a relatively narrow bandwidth. For example, in an embodiment, laser diodes may be used that provide radiation with a wavelength of approximately 405 nm and a bandwidth of approximately 10 nm.

In a lithographic apparatus such as that depicted in FIG. 5, a plurality of spots of radiation may be simultaneously projected onto the substrate. Therefore, in an embodiment, the radiation intensity sensor 55 may be configured to measure the intensity of the radiation redirected back from one or more or all of the spots separately. The controller 54 in turn may compare the measured intensity of the radiation redirected back from each spot with the intensity of the radiation projected onto the resist layer 56, providing multiple separate values of, for example, the reflectivity of the resist layer 56. These may be averaged by the controller to provide a reflectivity value for the region of the resist layer 56 on which the spots are projected.

In an embodiment, the radiation intensity sensor 55 may be configured to measure the total intensity of radiation redirected back from the resist layer 56 or the intensity of the radiation redirected back from a local portion of the resist layer on which the patterned beam of radiation is projected. In such an arrangement, the controller 54 may compare the total measured redirected radiation intensity to the total intensity of radiation projected onto the corresponding local portion of the resist layer 56, effectively providing, for example, an average reflectivity across the local portion of the resist layer 56.

As discussed above, the controller 54 compares the measured intensity of the radiation redirected back from the resist layer 56 to the intensity of the radiation projected onto the resist layer 56 in order to determine the reflectivity of the resist layer 56 to the wavelength of radiation being used. In an embodiment, the controller 54 may base this comparison on the control data used to control the lithographic apparatus, for example the laser diodes, to provide the patterned beam of radiation. In other words, it may assume that the intensity of the patterned beam of radiation projected onto the resist layer 56 corresponds to the intended intensity of the patterned beam of radiation. This may be a reasonable assumption, as the control of the laser diode units may be periodically calibrated and any loss of calibration in use may have a much smaller effect than variations in the reflectivity of the resist layer 56 caused by variations in the thickness of the resist layer 56.

Figure 6:
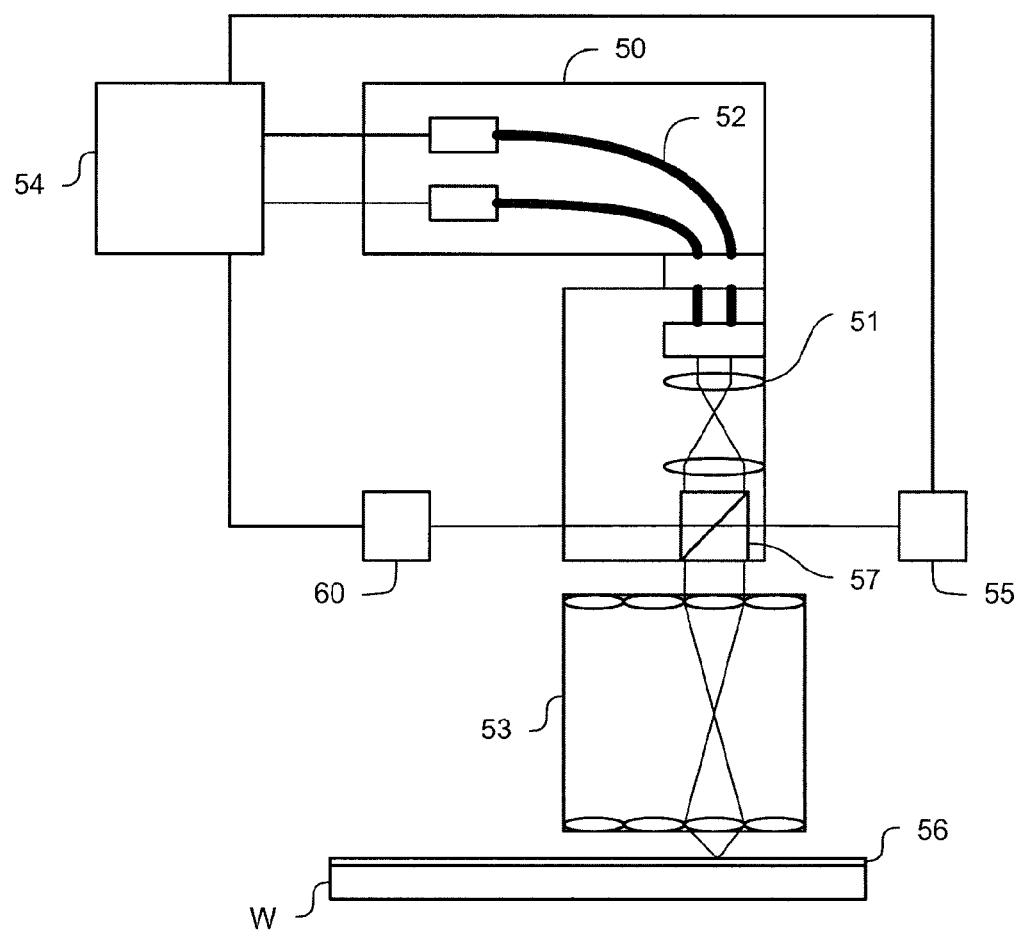
FIG. 6 depicts a variation of the arrangement depicted in FIG. 5.

Alternatively or additionally, as shown in FIG. 6, the lithographic apparatus may have a second radiation intensity sensor 60, configured to measure the intensity of the radiation projected onto the resist layer 56. Therefore the controller may compare the measured intensity of the radiation projected onto the resist layer 56 with the measured intensity redirected back from the resist layer in order to determine the reflectivity of the resist layer 56. Furthermore, the second radiation intensity sensor may be used to calibrate and/or update calibration of the control of the intensity of the patterned beam of radiation.

As with the radiation intensity sensor 55 used to measure the intensity of the radiation redirected back from the resist layer 56 discussed above, the second radiation intensity sensor 60 may be configured to measure the intensity of the radiation used to form each spot on the resist layer 56 or may be configured to measure the overall radiation intensity for the patterned beam of radiation or a part thereof.

As discussed above, the controller 54 may be configured to adjust the intensity of the patterned beam of radiation to be used based on the determined reflectivity of the resist layer 56. In this context, the patterned beam of radiation will in any case have a variation in intensity necessary to provide a desired pattern on the substrate. Therefore the controller 54 may be configured to control, based on the determined reflectivity of the resist layer 56, at least one of the maximum intensity in the patterned beam of radiation, the minimum intensity in the patterned beam of radiation and one or more intermediate intensity values within the patterned beam of radiation. For example, the controller 54 may be configured to determine a set of nominal radiation intensity levels for the patterned beam of radiation to provide a desired pattern on the substrate W and a common correction factor to be applied to each of these intensity levels in order to compensate for the reflectivity of the resist layer 56.

The apparatus as depicted in FIGS. 5 and 6 may determine the reflectivity of the resist layer 56 at a first region of the substrate based on the radiation redirected back from the patterned beam of radiation. This reflectivity value may be used by the controller 54 to control the generation of the patterned beam of radiation to be subsequently projected onto a second region of the substrate. Although the reflectivity value for a first region may therefore be used to control the generation of the patterned beam of radiation to be used for a second region, this may provide sufficient accuracy because the variation in thickness of the resist layer 56 across the substrate is expected to be gradual in nature.

Accordingly, providing the first and second regions are relatively close, namely provided the determination of the reflectivity of the resist layer in the first region and the subsequent generation or modification of the control signals to provide the patterned beam for the second region can be performed relatively quickly, the reflectivity of the first region will provide a close approximation for the reflectivity of the second region.

In an embodiment, the lithographic apparatus may include a measurement system that obtains data relating to the thickness of the resist layer 56, such as the reflectivity of the resist layer 56, before the patterned beam of radiation is projected onto the resist layer 56 or the specific portion thereof. Accordingly, the patterned beam of radiation may be generated for each area of the resist layer 56 using data for that particular area 56.

In an embodiment, the measurement system may be configured to inspect the entire substrate before the patterned beam of radiation is projected onto any part of the substrate. For example, the substrate may be inspected in a measurement station before being transferred to a part of the apparatus in which the patterned beam of radiation is projected onto the substrate. Such an arrangement may permit more time in which to analyze the measurement data and generate or modify the control data used to generate the patterned beam of radiation. Accordingly, the cost of the equipment used to perform the analysis may be reduced.

In an embodiment, the measurement system may be provided adjacent to the components used to generate or provide the patterned beam of radiation. In particular, the lithographic apparatus may be configured such that, as a substrate W is scanned within the lithographic apparatus to enable the patterned beam of radiation to be projected onto each area of the substrate W, the measurement system may obtain the data relating to the thickness of the resist layer 56 on an area of the substrate shortly before the patterned beam of radiation is projected onto that area. Therefore, the control of the patterned beam of radiation projected onto that area may take into account the data obtained for that area.

Figure 7:
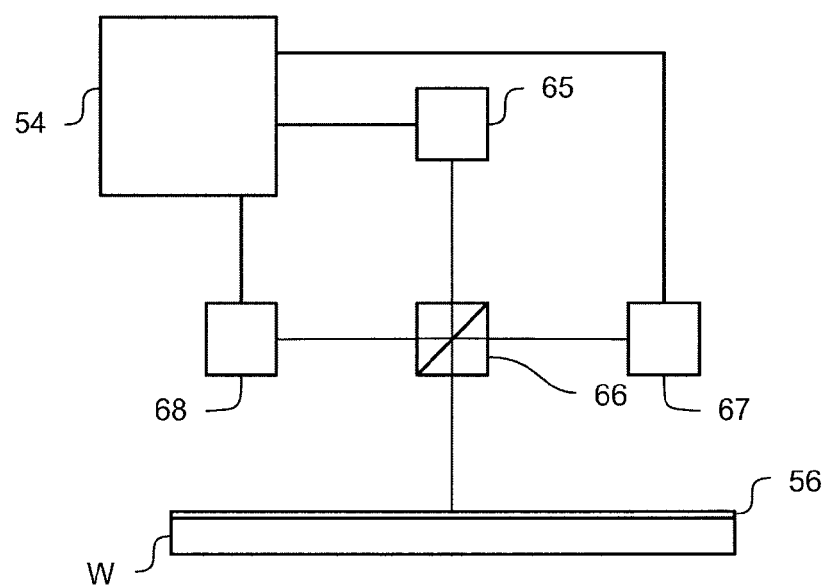
FIG. 7 depicts a portion of a lithographic apparatus according to an embodiment of the invention.

FIG. 7 depicts an arrangement of a measurement system that may be used in such an apparatus to measure before a particular exposure. As shown, the measurement system includes a radiation source 65 that generates a beam of radiation that is projected onto the resist layer 56 on the substrate W. The intensity of this beam of radiation provided by the measurement system may be set to be sufficiently low that it does not expose the resist or be a non-actinic wavelength.

As shown, the radiation source 65 may be separate from the radiation source used to provide the patterned beam of radiation. However, the radiation source 65 of the measurement system may provide radiation of the same wavelength as the wavelength of the patterned beam of radiation. In that case, the reflectivity data for the resist layer 56 may be used directly by the controller 54 when controlling the intensity of the patterned beam of radiation.

If a different wavelength is used, the controller may be configured to determine the expected reflectivity of the resist layer 56 for the wavelength of the patterned beam of radiation based on the reflectivity of the radiation of the measurement system. For example, the conversion may be based on look-up tables or may be determined by using the measured reflectivity data to determine the thickness of the resist layer 56. This determined thickness may in turn be used to determine the expected reflectivity of the resist layer 56 for the patterned beam of radiation.

As shown in FIG. 7, the measurement system may include a first radiation inspection system 67, configured to determine the intensity of the radiation redirected from the resist layer 56 on the substrate W. The controller 54 may compare this with the known intensity of the beam of radiation provided by the source 65 in order to determine the reflectivity of the resist layer 56. In this case, the radiation source 65 may require periodic recalibration in order to ensure that the intensity of the output radiation remains substantially constant.

Alternatively, or additionally, in an embodiment, as depicted in FIG. 7, a second radiation inspection system 68 may be provided in order to measure the intensity of the radiation projected onto the resist layer 56 by the measurement system. Accordingly, the controller 54 may compare the measured intensity of the radiation projected onto the resist layer 56 with the measured intensity of the radiation redirected from the resist layer 56.

As depicted in FIG. 7, in an arrangement of the measurement system of this embodiment, a partial reflector 66 may be provided. The beam of radiation from the radiation source 65 may pass through the partial reflector such that a known proportion passes through the partial reflector 66 and is projected onto the resist layer 56 and a known proportion is reflected to the second radiation beam inspection system 68 to provide a measurement of the intensity of the radiation projected onto the resist layer. The radiation redirected back from the resist layer 56 is reflected by the partial reflector 66 to the first radiation inspection system 67 to provide the measurement of the intensity of the redirected radiation. Other arrangements may be used.

As discussed above, the measurement system of any of the embodiments of the invention may be configured to provide measurement data that is used to determine the reflectivity of the resist layer 56, which is related to the thickness of the resist layer, as discussed above. However, in variations of the above embodiments, the measurement system may be configured to determine the thickness of the resist layer 56, directly or indirectly. For example, the measurement system may measure the thickness of the resist layer using a scatterometer, a capacitive sensor or an ultrasonic sensor.

The controller 54 may then control the formation of the patterned beam of radiation using the thickness data. For example, the controller 54 may be configured to determine from the thickness of the resist layer 56 the expected reflectivity of the resist layer 56 and control the formation of the patterned beam of radiation accordingly. Alternatively, the controller 54 may use an algorithm and/or comprise a look-up table that provides the controller 54 with data relating to the radiation intensity of the patterned beam to be used for a given thickness of the resist layer.

It should be appreciated that the invention is not limited to the embodiments and variations described above. For example, an embodiment of the invention may be used with a lithographic apparatus that uses a radiation source other than laser diodes. In particular, an embodiment of the present invention may be applied to a lithographic apparatus that has a radiation source providing a beam of radiation and a separate programmable patterning device, such as an array of deformable mirrors, that is used to impart a pattern to the beam of radiation.

Furthermore, an embodiment of the present invention may be applied to a lithographic apparatus that does not use a programmable patterning device to provide a pattern to be applied to a substrate. In other words, an embodiment of the invention may be used with a lithographic apparatus that uses a fixed patterning device, such as a reticle, to impart a pattern to a beam of radiation. In such a lithographic apparatus, the radiation source may be controlled to vary the intensity of the beam of radiation as desired to control the radiation dose provided to the resist layer. Alternatively or additionally, a variable attenuator may be provided that controls the intensity of the beam of radiation, as required.

Depending on the chosen process to be used, one or more additional layers of material may be formed on the substrate together with the layer of resist itself to form a stack of layers on the substrate. The reflectivity to the patterned beam of radiation may be dependent on the thickness of the combined stack, namely including the additional layers provided with the resist itself. Any reference in this application to the thickness of the layer of resist may refer to the thickness of the combined stack.

In accordance with a device manufacturing method, a device, such as a display, integrated circuit or any other item may be manufactured from the substrate on which the pattern has been projected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, configured to project an exposure beam of radiation onto a substrate, the apparatus comprising:
    a measurement system, configured to provide measurement data related to a thickness of a resist layer on a first region of the substrate, and configured to measure intensity of radiation derived from the exposure beam of radiation to expose the resist layer of the first region of the substrate, that is redirected back from the layer of resist to generate the measurement data; and
    a controller, configured to control the operation of the lithographic apparatus such that a radiation intensity level in an exposure beam to be subsequently projected onto a different second region of the same substrate is controlled based on the measurement data.

2. The lithographic apparatus according to claim 1, further comprising a programmable patterning device, configured to provide the exposure beam of radiation, wherein the controller is configured to control the operation of the programmable patterning device in order to control the radiation intensity level in the exposure beam of radiation.

3. The lithographic apparatus according to claim 2, wherein the controller is configured to control the programmable patterning device such that the lithographic apparatus projects onto the substrate an exposure beam in which the intensity of the radiation varies between a minimum and a maximum intensity level according to a desired pattern; and the controller is configured such that, in order to adjust the radiation intensity level in the exposure beam of radiation, it adjusts a minimum radiation intensity level, a maximum radiation intensity level, an intermediate intensity level, or any combination thereof, to be used in providing the desired pattern.

4. The lithographic apparatus according to claim 1, wherein the measurement system is configured to provide measurement data related to the thickness of the resist layer in an area of the substrate based on a measurement taken before the exposure beam of radiation is projected onto the area of on the substrate; and the controller is configured to control the operation of the lithographic apparatus when the exposure beam of radiation is projected onto the area of the substrate based on the measurement.

5. The lithographic apparatus according to claim 4, wherein the measurement system is configured to provide measurement data related to the thickness of a resist layer on a substrate in a plurality of areas across the substrate based on a plurality of measurements taken before the exposure patterned beam of radiation is projected onto any such areas of the substrate; and the controller is configured to control the operation of the lithographic apparatus based on the measurement data for each respective area of the substrate when the exposure beam of radiation is subsequently projected onto each of the areas of the substrate.

6. The lithographic apparatus according to claim 4, wherein the measurement system is configured to take measurements to provide measurement data related to the thickness of the resist layer for a first area of the substrate while the exposure beam of radiation is projected onto a different second area of the substrate.

7. The lithographic apparatus according to claim 1, wherein the controller is configured to compare the measured intensity level of the radiation redirected back from the layer of resist with the intensity of the exposure beam of radiation intended to be projected onto the substrate at a location corresponding to the location at which the intensity level is measured to determine a measure of the reflectivity of the resist layer, wherein the intensity of the exposure beam of radiation intended to be projected onto the substrate is the intensity prior to the incidence of the exposure beam of radiation onto the substrate.

8. The lithographic apparatus according to claim 7, further comprising a programmable patterning device and wherein the controller is configured to compare the measured intensity level of the radiation redirected back from the layer of resist with data corresponding to a control signal provided to the programmable patterning device used to set the programmable patterning device to provide a desired radiation intensity level in the exposure beam of radiation projected onto the substrate at the location corresponding to the measured intensity level.

9. The lithographic apparatus according to claim 7, wherein the controller is configured to use the measure of the reflectivity of the resist layer to control the intensity of the exposure beam of radiation to be projected onto the substrate such that a desired pattern of radiation dose received by the resist layer is provided.

10. The lithographic apparatus according to claim 1, wherein the measurement system is configured to measure the intensity of the exposure beam of radiation projected onto the layer of resist, wherein the measured intensity of the exposure beam of radiation projected onto the layer of resist is the intensity of the exposure beam of radiation prior to incidence onto the layer of resist; and the controller is configured to compare the measured intensity of the exposure beam of radiation projected onto a location on the resist layer with the measured intensity of radiation redirected back from the location on the resist layer in order to determine a measure of the reflectivity of the resist layer.

11. The lithographic apparatus according to claim 1, wherein the measurement system is further configured to project a beam of radiation onto the resist layer that has a lower intensity than the exposure beam of radiation, and to measure the intensity of the lower intensity radiation redirected back from the resist layer; and the controller is configured to compare the intensity of the beam of lower intensity radiation projected onto the resist layer by the measurement system with the intensity of the lower intensity radiation redirected back from the resist layer in order to determine a measure of the reflectivity of the resist layer.

12. The lithographic apparatus according to claim 1, comprising a partial reflector arranged such that the exposure beam of radiation passes through the partial reflector before it is incident on the substrate and such that radiation redirected back from the resist layer on the substrate is reflected by the partial reflector into a radiation intensity sensor.

13. The lithographic apparatus according to claim 12, wherein the measurement system is configured to measure the intensity of the exposure beam of radiation projected onto the layer of resist; and the controller is configured to compare the measured intensity of the exposure beam of radiation projected onto a location on the resist layer with the measured intensity of radiation redirected back from the location on the resist layer in order to determine a measure of the reflectivity of the resist layer, wherein the partial reflector is configured to reflect a portion of the exposure beam of radiation before it is incident on the substrate to a second radiation intensity sensor.

14. The lithographic apparatus according to claim 1, wherein the measurement system is configured to measure the thickness of the resist layer.

15. The lithographic apparatus according to claim 14, wherein the controller is configured to determine an expected reflectivity of the resist layer based on the measured thickness of the resist layer.

16. The lithographic apparatus according to claim 14, wherein the measurement system comprises a scatterometer.

17. A device manufacturing method, comprising:
using a lithographic apparatus to project an exposure beam of radiation onto a substrate;
obtaining measurement data related to a thickness of a resist layer on a first region of the substrate based on measuring intensity of radiation derived from the exposure beam of radiation to expose the resist layer, that is redirected back from the layer of resist; and controlling the operation of the lithographic apparatus to control the radiation intensity level in an exposure beam to be subsequently projected onto a different second region of the same substrate based on the measurement data.

18. A lithographic apparatus, configured to project an exposure beam of radiation onto a substrate, the apparatus comprising:
   a measurement system configured to measure intensity of radiation derived from an exposure beam of radiation that is redirected back from a resist layer on a first region of the substrate; and
   a controller configured to:
      compare an intensity level of the exposure beam of radiation prior to incidence onto the resist layer with a measured intensity level of the radiation redirected back from the layer of resist to determine a measure of the reflectivity of the resist layer, and
      control the operation of the lithographic apparatus such that a radiation intensity level in an exposure beam to be subsequently projected onto a different second region of the substrate is controlled based on the measure.

19. The lithographic apparatus of claim 18, further comprising a programmable patterning device and wherein the intensity level of the exposure beam of radiation prior to incidence onto the resist layer corresponds to a control signal provided to the programmable patterning device used to set the programmable patterning device to provide a desired radiation intensity level in the exposure beam of radiation projected onto the substrate at the location corresponding to the measured intensity level, or corresponds to a measured intensity of the exposure beam of radiation prior to incidence onto the layer of resist.

* * * * *